United States Patent
Chen et al.

(10) Patent No.: US 9,306,043 B2
(45) Date of Patent: Apr. 5, 2016

(54) BIPOLAR JUNCTION TRANSISTOR AND OPERATING AND MANUFACTURING METHOD FOR THE SAME

(71) Applicant: MACRONIX INTERNATIONAL CO., LTD., Hsinchu (TW)

(72) Inventors: Li-Fan Chen, Hsinchu (TW); Wing-Chor Chan, Hsinchu (TW); Jeng Gong, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 233 days.

(21) Appl. No.: 13/868,134

(22) Filed: Apr. 23, 2013

(65) Prior Publication Data
US 2014/0266407 A1    Sep. 18, 2014

Related U.S. Application Data

(60) Provisional application No. 61/778,613, filed on Mar. 13, 2013.

(51) Int. Cl.
| | | |
|---|---|---|
| *H01L 29/735* | (2006.01) | |
| *H01L 29/66* | (2006.01) | |
| *H01L 29/40* | (2006.01) | |
| *H01L 29/06* | (2006.01) | |

(52) U.S. Cl.
CPC ............ *H01L 29/735* (2013.01); *H01L 29/063* (2013.01); *H01L 29/0692* (2013.01); *H01L 29/402* (2013.01); *H01L 29/6625* (2013.01)

(58) Field of Classification Search
CPC ...................... H01L 29/66234; H01L 29/6625; H01L 29/735; H01L 29/73; H01L 29/1004; H01L 29/0804; H01L 29/0821; H01L 29/1008; H01L 29/0808
See application file for complete search history.

(56) References Cited

U.S. PATENT DOCUMENTS

| | | |
|---|---|---|
| 8,482,059 B2 | 7/2013 | Lin et al. |
| 2011/0121428 A1* | 5/2011 | Lin et al. ................. 257/592 |

FOREIGN PATENT DOCUMENTS

TW    201246495 A1    11/2012

OTHER PUBLICATIONS

TIPO Office Action dated Nov. 13, 2015 in corresponding Taiwan application (No. 102109971).

* cited by examiner

*Primary Examiner* — Jose R Diaz
(74) *Attorney, Agent, or Firm* — McClure, Qualey & Rodack, LLP

(57)    ABSTRACT

A bipolar junction transistor and an operating method and a manufacturing method for the same are provided. The bipolar junction transistor comprises a first doped region, a second doped region and a third doped region. The first doped region has a first type conductivity. The second doped region comprises well regions formed in the first doped region, having a second type conductivity opposite to the first type conductivity, and separated from each other by the first doped region. The third doped region has the first type conductivity. The third doped region is formed in the well regions or in the first doped region between the well regions.

16 Claims, 10 Drawing Sheets

BIPOLAR JUNCTION TRANSISTOR AND OPERATING AND MANUFACTURING METHOD FOR THE SAME

This application claims the benefit of a provisional application Ser. No. 61/778,613, filed Mar. 13, 2013, the subject matter of which is incorporated herein by reference.

BACKGROUND

1. Technical Field

The disclosure relates to a semiconductor device and operating and manufacturing methods for the same, and more particularly to a bipolar junction transistor and operating and manufacturing methods for the same

2. Description of the Related Art

In a semiconductor bipolar junction transistor (BJT) device, by controlling the voltages applied to its base and collector terminals, the device may operate in a forward-active mode. Taking an NPN-type BJT device as an example, i.e., a BJT device with a P-type base region and N-type collector and emitter regions, in operation, a positive voltage VBE and a positive voltage VCE higher than VBE may be applied to the base terminals and the collector terminals, respectively. The emitter-base junction may be therefore forward-biased and the base-collector junction may be therefore reverse-biased, and a base current IB and a collector current IC which by definition is β times the base current IB may be induced. The BJT device may therefore serve as a current amplifier with a current gain or beta gain β.

SUMMARY

According to one aspect of the present disclosure, a bipolar junction transistor is provided. The bipolar junction transistor comprises a first doped region, a second doped region and a third doped region. The first doped region has a first type conductivity. The second doped region comprises well regions formed in the first doped region, having a second type conductivity opposite to the first type conductivity, and separated from each other by the first doped region. The third doped region has the first type conductivity. The third doped region is formed in the well regions or in the first doped region between the well regions.

According to another aspect of the present disclosure, an operating method for a bipolar junction transistor is provided. The bipolar junction transistor comprises a first doped region, a second doped region and a third doped region. The first doped region has a first type conductivity. The second doped region comprises well regions formed in the first doped region. The well regions have a second type conductivity opposite to the first type conductivity. The well regions are separated from each other by the first doped region. The third doped region has the first type conductivity. The third doped region is formed in the well regions or in the first doped region between the well regions. The operating method comprises following steps. A collector voltage is provided to the first doped region. A base voltage is provided to the second doped region. An emitter voltage is provided to the third doped region.

According to yet another aspect of the present disclosure, a manufacturing method for a bipolar junction transistor is provided. The method comprises following steps. Well regions of a second doped region are formed in a first doped region. The first doped region has a first type conductivity. The well regions have a second type conductivity opposite to the first type conductivity. The well regions are separated from each other by the first doped region. A third doped region having the first type conductivity is formed in the well regions or the first doped region between the well regions.

The above and other aspects of the disclosure will become better understood with regard to the following detailed description of the non-limiting embodiment(s). The following description is made with reference to the accompanying drawings.

DETAILED DESCRIPTION

Figure 1A:
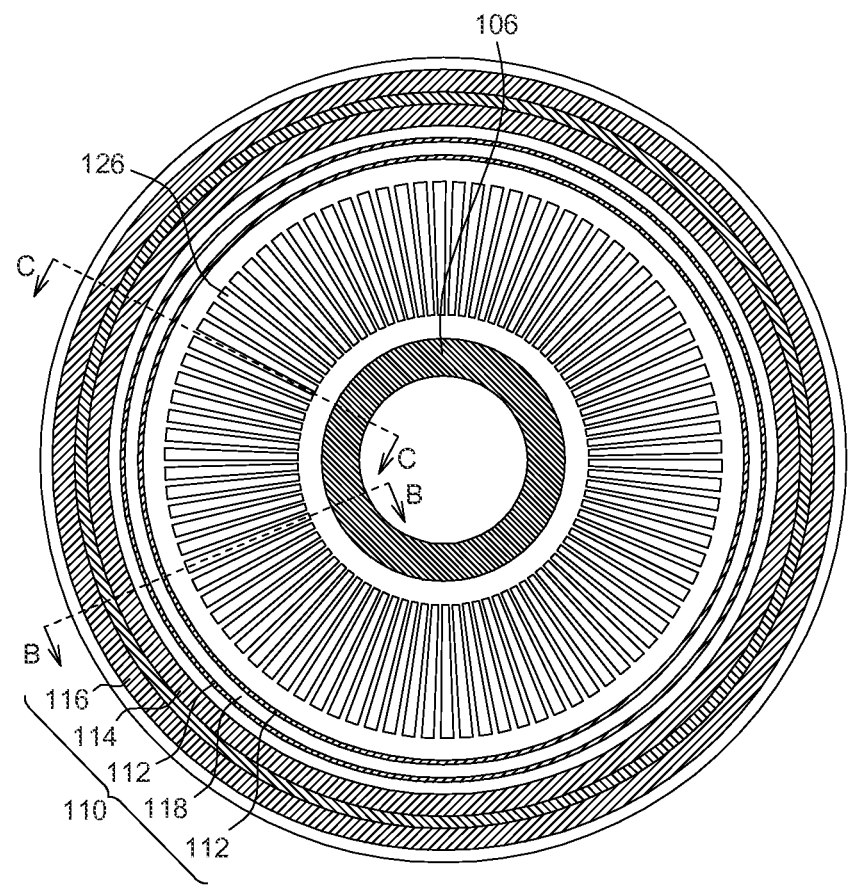
FIG. 1A illustrates a top view of the bipolar junction transistor according to one embodiment.
Figure 1B:
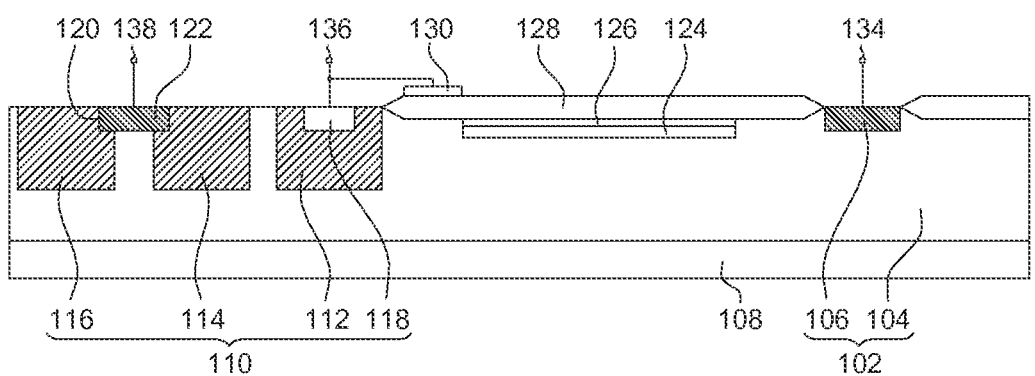
FIG. 1B is a cross-section view of the bipolar junction transistor along BB line in FIG. 1A.
Figure 1C:
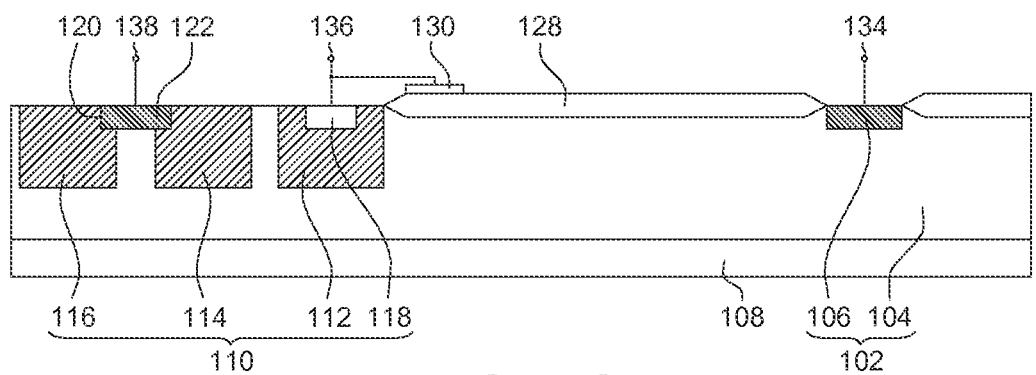
FIG. 1C is a cross-section view of the bipolar junction transistor along CC line in FIG. 1A.

FIG. 1A illustrates a top view of a bipolar junction transistor (BJT) according to one embodiment. FIG. 1B is a cross-section view of the bipolar junction transistor along BB line. FIG. 1C is a cross-section view of the bipolar junction transistor along CC line.

Referring to FIG. 1B, a first doped region 102 comprises a well region 104 and a contact region 106. The well region 104 and the contact region 106 have a first type conductivity such as N-type conductivity. The well region 104 is on a substrate 108. The substrate 108 having a second type conductivity such as P-type conductivity, opposite to the first type conductivity. In one embodiment, the well region 104 may be formed by doping the substrate 108. In other embodiments, the well region 104 may be formed on the substrate 108 by a growth method, a deposition method, etc. The well region 104 may be a HV well region. The well region 104 and the substrate 108 may comprise a semiconductor material such as silicon or other suitable materials. The substrate 108 may comprise a SOI. The contact region 106 may be formed by doping the well region 104. In embodiments, the contact region 106 may be a heavily doped region.

Referring to FIG. 1B, a second doped region 110 comprises well regions 112, 114, 116. The well regions 112, 114, 116 have a second type conductivity such as P-type conductivity. The well regions 112, 114, 116 may be formed by doping the well region 104 of the first doped region 102. The well regions 112, 114, 116 may be formed by an epitaxial method. The well regions 112, 114, 116 of the second doped region 110 may be separated from each other by the well region 104 of the first doped region 102. The second doped region 110 comprises a contact region 118 having the second type conductivity such as P-type conductivity. The contact region 118 may be formed by doping the well region 112, and may be a heavily doped region.

Referring to FIG. 1B, a third doped region 120 comprises a contact region 122. The contact region 122 has the first type conductivity such as N-type conductivity. The contact region 122 may be formed by a method comprising doping the well regions 114, 116 of the second doped region 110 and doping the well region 104 of the first doped region 102 between the well region 114 and the well region 116. The contact region 122 may be a heavily doped region.

Referring to FIG. 1B, a first top doped layer 124 having the second type conductivity is on the well region 104 of the first doped region 102 having the first type conductivity. The first top doped layer 124 may be formed by doping the well region 104. A second top doped layer 126 having the first type conductivity is on the first top doped layer 124. The second top doped layer 126 may be formed by doping the first top doped layer 124. A dielectric structure 128 is formed on the second top doped layer 126. The dielectric structure 128 is not limited to FOX as shown in FIGS. 1B and 1C, and may comprise other suitable dielectric structures such as STI, etc. A conductive structure 130 is formed on the dielectric structure 128. In one embodiment, the conductive structure 130 comprises poly silicon, for example, formed by a single poly process or a double poly process.

The cross-section view of the bipolar junction transistor in FIG. 1C is different form the cross-section view of the bipolar junction transistor in FIG. 1B in that, FIG. 1C omits the first top doped layer 124 and the second top doped layer 126 in FIG. 1B. FIG. 1A is a top view illustrating only partial elements of the bipolar junction transistor, comprising: the contact region 106 of the first doped region 102; the well regions 112, 114, 116 and the contact region 118 of the second doped region 110; the contact region 122 of the third doped region 120; and the second top doped layer 126. The bipolar junction transistor is not limited to circle arrangement as shown in FIG. 1A, and may be designed into a structure having square, rectangle, hexagonal, octagonal shapes, or other kinds of shapes.

Figure 2A:
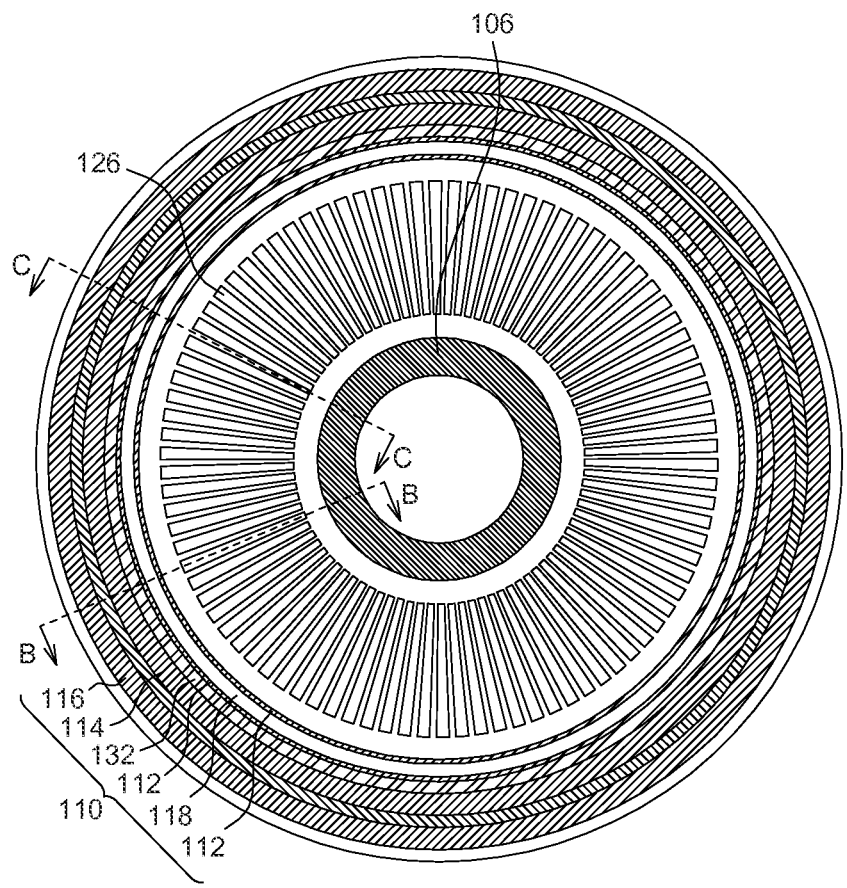
FIG. 2A illustrates a top view of the bipolar junction transistor according to one embodiment.
Figure 2B:
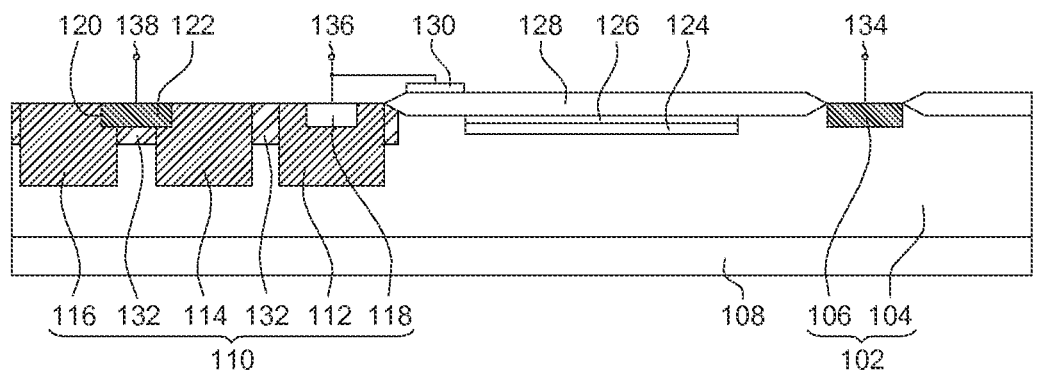
FIG. 2B is a cross-section view of the bipolar junction transistor along BB line in FIG. 2A.
Figure 2C:
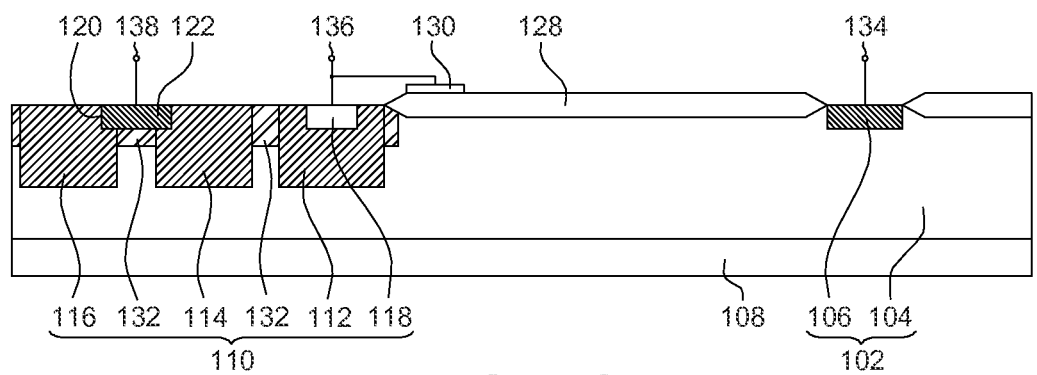
FIG. 2C is a cross-section view of the bipolar junction transistor along CC line in FIG. 2A.

FIG. 2A to FIG. 2C respectively illustrate the bipolar junction transistor of FIG. 1A to FIG. 1C after diffusing the well regions 112, 114, 116 of the second doped region 110. The step of diffusing the well regions 112, 114, 116 is for forming connecting regions 132 of the second doped region 110. The connecting region 132 under the contact region 122 of the third doped region 120 is adjoined between the well region 114 and the well region 116, and has the second type conductivity. Lower surfaces of the well regions 114, 116 are under lower surfaces of the connecting regions 132. The well regions 112, 114, 116 of the second doped region 110 may be diffused by a method comprising an annealing step. The annealing step may be performed at suitable timing. For example, the annealing step may be performed before or after forming the contact region 118 of the second doped region 110 and forming the contact region 122 of the third doped region 120.

Referring to FIG. 2B, in one embodiment, for example, the first doped region 102 of the bipolar junction transistor may be electrically connected to a collector voltage 134 through the contact region 106. The second doped region 110 may be electrically connected to a base voltage 136 through the contact region 118. The third doped region 120 may be electrically connected to a emitter voltage 138 through the contact region 122. In other words, the first doped region 102 comprising the well region 104 and the contact region 106 having the first type conductivity such as N-type conductivity is functioned as a collector. The second doped region 110 comprising the well regions 112, 114, 116, the connecting regions 132 and the contact region 118 having the second type conductivity such as P-type conductivity is functioned as a base. The third doped region 120 comprising the contact region 122 having the first type conductivity such as N-type conductivity is functioned as an emitter. The conductive structure 130 may be electrically connected to a structure voltage. In one embodiment, the structure voltage is coupled to the base voltage 136.

Referring to FIG. 2B, in embodiments, the well regions 112, 114, 116 after being diffused and the connecting regions 132 formed by the diffusion have a dopant concentration lower than a dopant concentration of the well regions 112, 114, 116 before being diffused, and it can improve the common-emitter current gain (Beta; $\beta$) of the bipolar junction transistor. In addition, the formed connecting regions 132 can have tiny features such as a shallow depth or a narrow width, and it can increase the base resistance and improve the Beta $\beta$. Thus, in other words, in embodiments, the connecting regions 132 may be adjusting for controlling the Beta $\beta$ of the bipolar junction transistor, by adjusting the conditions of the well regions 112, 114, 116 of the second doped region 110, such as adjusting the gap size between the well regions 112, 114, 116, or adjusting the process (such as the annealing process) parameters for diffusing the well regions 112, 114, 116.

Moreover, the first top doped layer 124 and the second top doped layer 126 using the reduced surface field (RESURF) concept and formed in the well region 104 (drift region) under the dielectric structure 128 can be used for increasing the breakdown voltage of the high voltage bipolar junction transistor (HVBJT). The conductive structure 130 disposed on the dielectric structure 128 between the (collector) contact region 106 and the (base) contact region 118 can be used for increasing the junction breakdown voltage of the bipolar junction transistor. In one embodiment, the device feature and the operating voltage of the bipolar junction transistor can be reduced by shrinking the size of the drift region (well region 104). In embodiments, the gap distance between the (emitter) contact region 122 and the (collector) contact region 106 can be optimized for avoiding the lateral punch through effect for the bipolar junction transistor, and the concept can be applied to HV devices.

In embodiments, the bipolar junction transistor can be manufactured by using the standard HV process, and thus additional process, masks, or setting new recipes are not need.

Figure 3A:
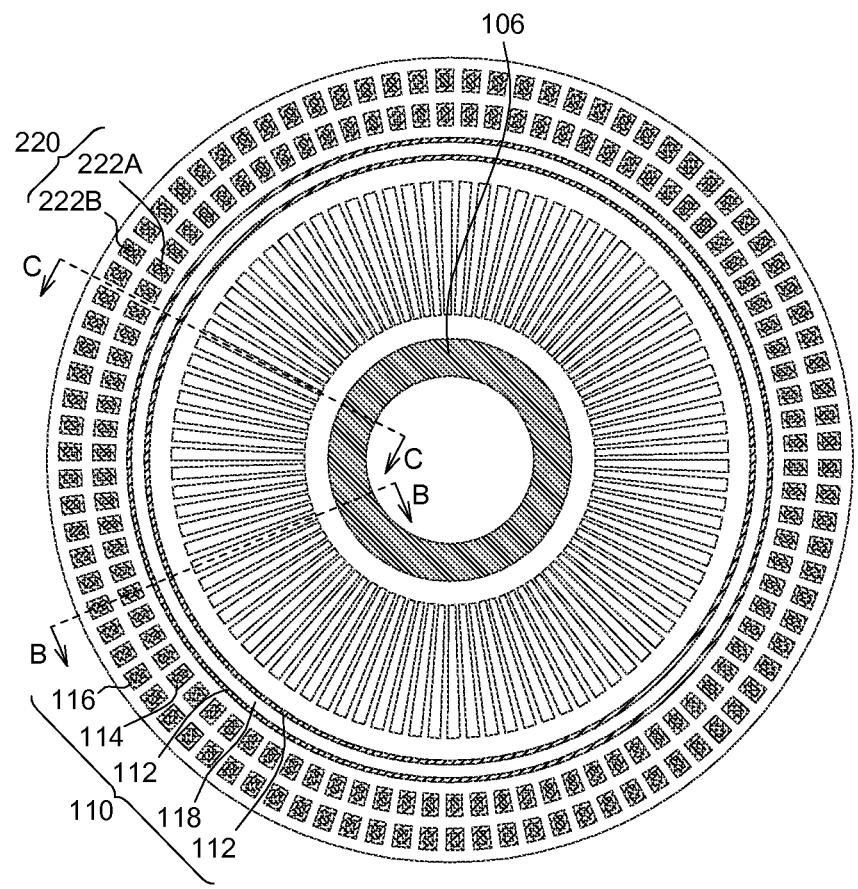
FIG. 3A illustrates a top view of the bipolar junction transistor according to one embodiment.
Figure 3B:
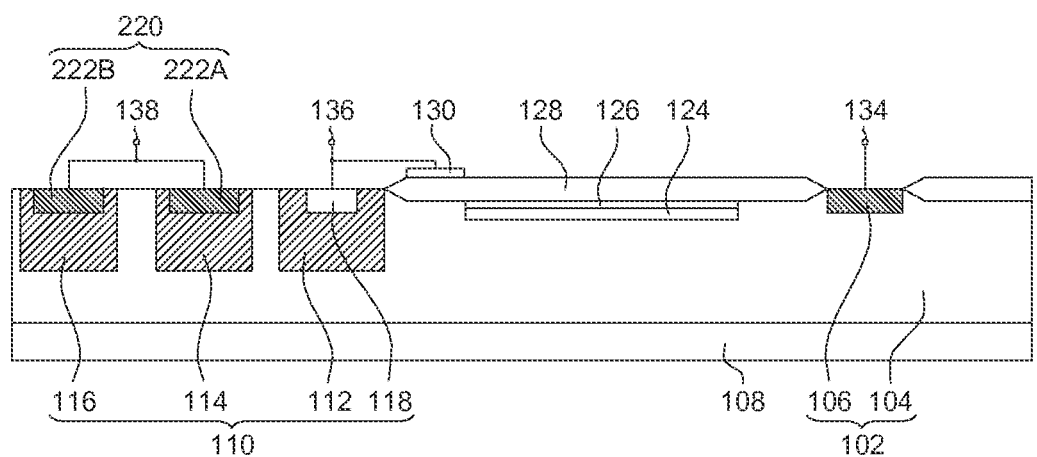
FIG. 3B is a cross-section view of the bipolar junction transistor along BB line in FIG. 3A.
Figure 3C:
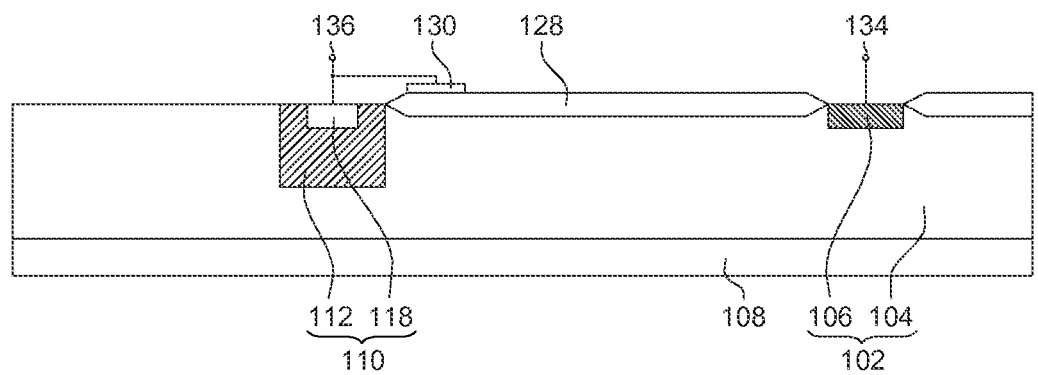
FIG. 3C is a cross-section view of the bipolar junction transistor along CC line in FIG. 3A.

FIG. 3A illustrates a top view of the bipolar junction transistor according to one embodiment. FIG. 3B is a cross-section view of the bipolar junction transistor along the BB line. FIG. 3C is the cross-section view of the bipolar junction transistor along CC line The bipolar junction transistor in FIGS. 3A to 3B is different form bipolar junction transistor in FIGS. 1A to 1B in that the contact regions 222A, 222B of the third doped region 220 are formed in the well regions 114, 116 of the second doped region 110. The cross-section view in FIG. 3B is different form the cross-section view in FIG. 3C in that, FIG. 3C omits the well regions 114, 116 of the second doped region 110 and the contact regions 222A, 222B of the third doped region 220. The well regions 114, 116 of the second doped region 110 and the contact regions 222A, 222B of the third doped region 220 are not limited to the rectangle arrangement as shown in FIG. 3A, and may be designed as square, hexagonal, octagonal, circle shapes, or other kinds of shapes.

Figure 4A:
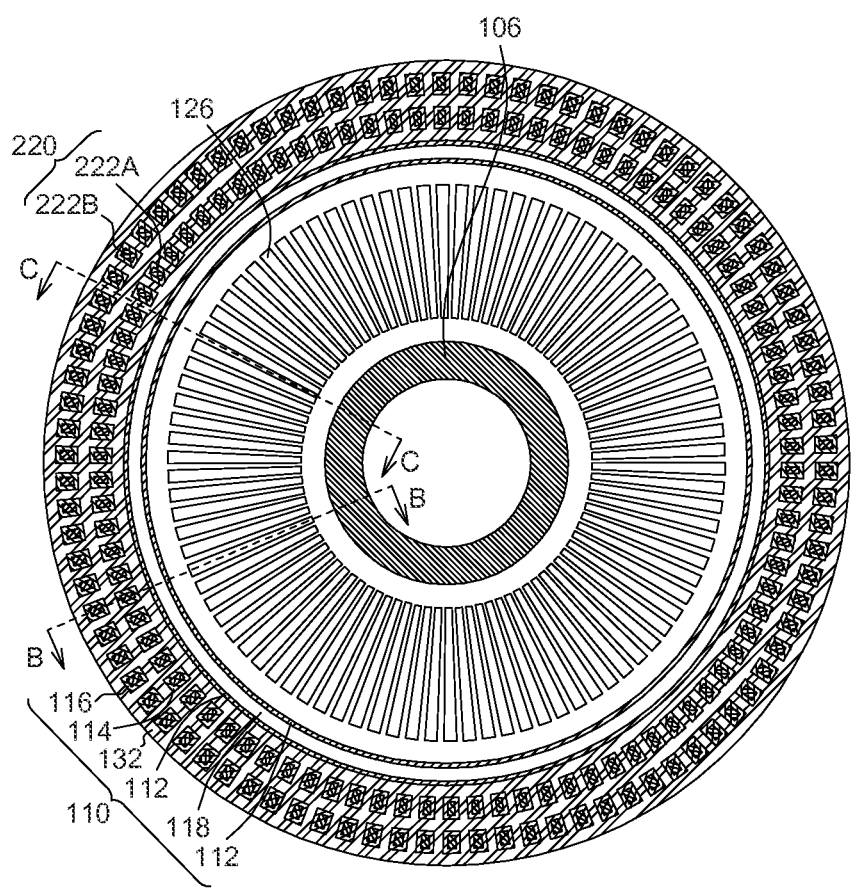
FIG. 4A illustrates a top view of the bipolar junction transistor according to one embodiment.
Figure 4B:
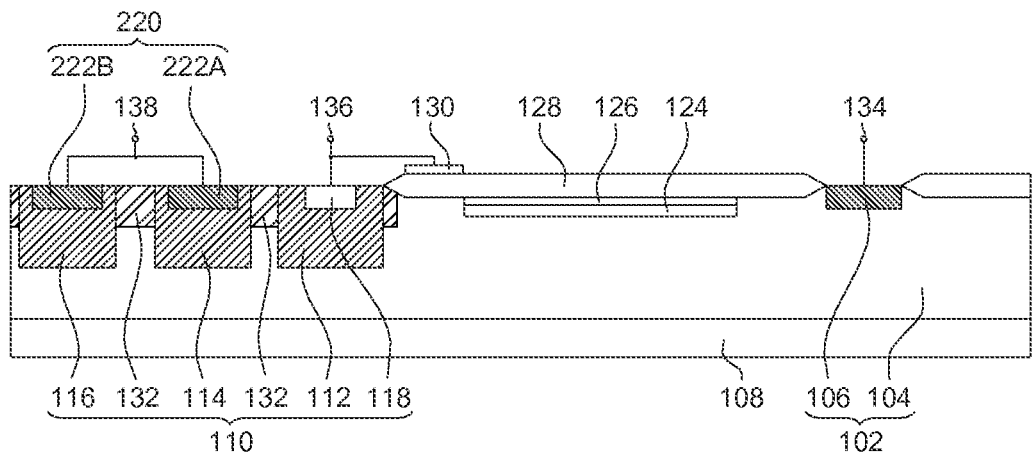
FIG. 4B is a cross-section view of the bipolar junction transistor along BB line in FIG. 4A.
Figure 4C:
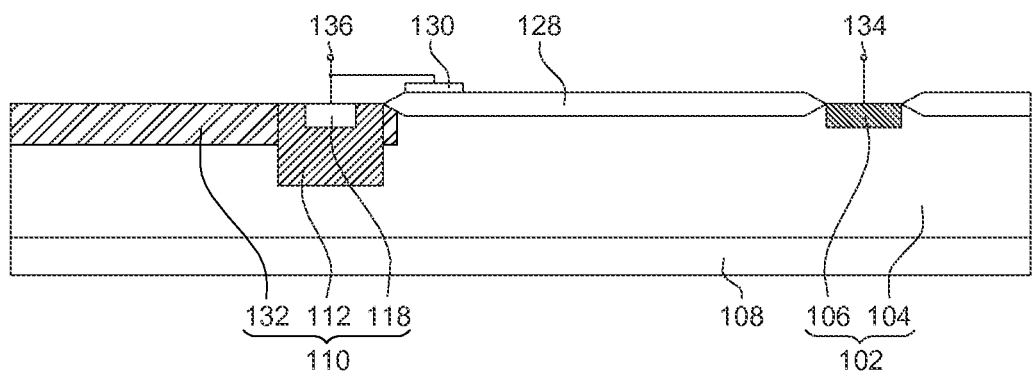
FIG. 4C is a cross-section view of the bipolar junction transistor along CC line in FIG. 4A.

FIG. 4A to FIG. 4C respectively illustrate the bipolar junction transistor of FIG. 3A to FIG. 3C after diffusing the well regions 112, 114, 116 of the second doped region 110. The step of diffusing the well regions 112, 114, 116 is for forming connecting regions 132 of the second doped region 110. The connecting regions 132 are adjoined between the well regions 112, 114, 116, and have the second type conductivity. The lower surfaces of the well regions 112, 114, 116 are the under lower surfaces of the connecting regions 132. The well regions 112, 114, 116 of the second doped region 110 may be diffused by a method comprising an annealing step. The annealing step may be performed at suitable timing. For example, the annealing step may be performed before forming the contact regions 222A, 222B of the third doped region 220.

Referring to FIG. 4B and FIG. 4C, in one embodiment, for example, the first doped region 102 of the bipolar junction transistor may be electrically connected to the collector voltage 134 through the contact region 106. The second doped region 110 may be electrically connected to the base voltage 136 through the contact region 118. The third doped region 220 may be electrically connected to a emitter voltage 138 through the contact regions 222A, 222B. In other words, the first doped region 102 comprising the well region 104 and the contact region 106 having the first type conductivity such as N-type conductivity is functioned as the collector. The second doped region 110 comprising the well regions 112, 114, 116, the connecting regions 132 and the contact region 118 having the second type conductivity such as P-type conductivity is functioned as the base. The third doped region 220 comprising the contact regions 222A, 222B having the first type conductivity such as N-type conductivity is functioned as the emitter. The conductive structure 130 may be electrically connected to the structure voltage. In one embodiment, the structure voltage is coupled to the base voltage 136.

In embodiments, the well regions 112, 114, 116 after being diffused and the connecting regions 132 formed by the diffusion have the dopant concentration lower than the dopant concentration of the well regions 112, 114, 116 before being diffused, and it can improve the Beta β of the bipolar junction transistor. In addition, the formed connecting regions 132 can have tiny features such as a shallow depth or a narrow width, and it can increase the base resistance and improve the Beta β. Thus, in other words, in embodiments, the connecting regions 132 may be adjusting for controlling the Beta β of the bipolar junction transistor, by adjusting the conditions of the well regions 112, 114, 116 of the second doped region 110, such as adjusting the gap size between the well regions 112, 114, 116, or adjusting the process (such as the annealing process) parameters for diffusing the well regions 112, 114, 116.

Figure 5A:
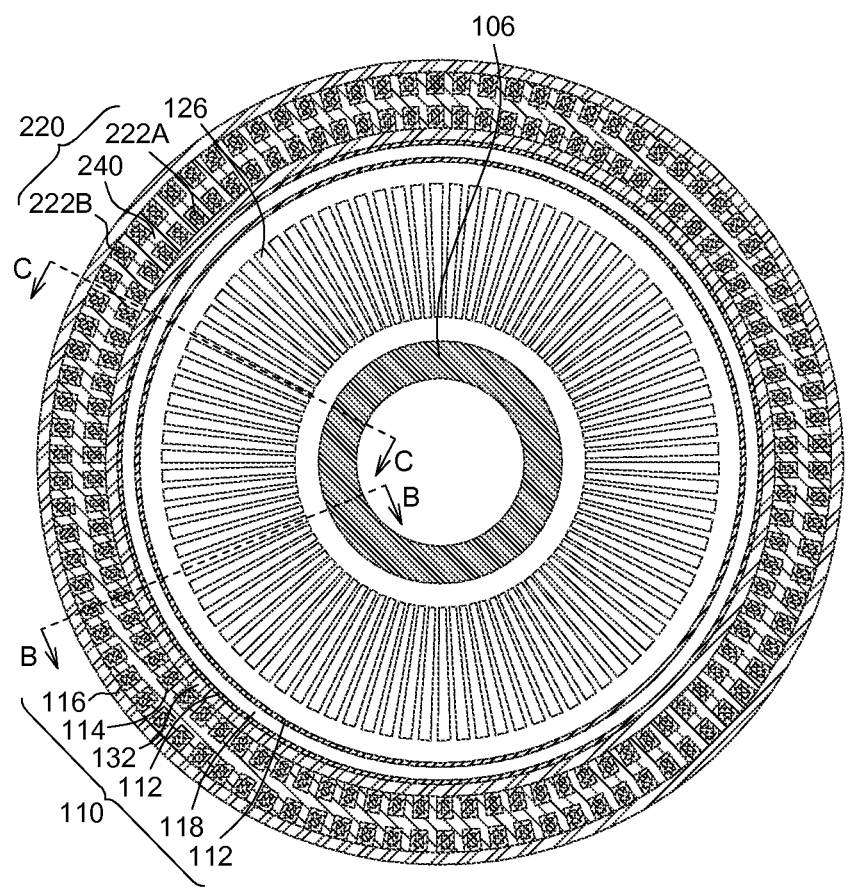
FIG. 5A illustrates a top view of the bipolar junction transistor according to one embodiment.
Figure 5B:
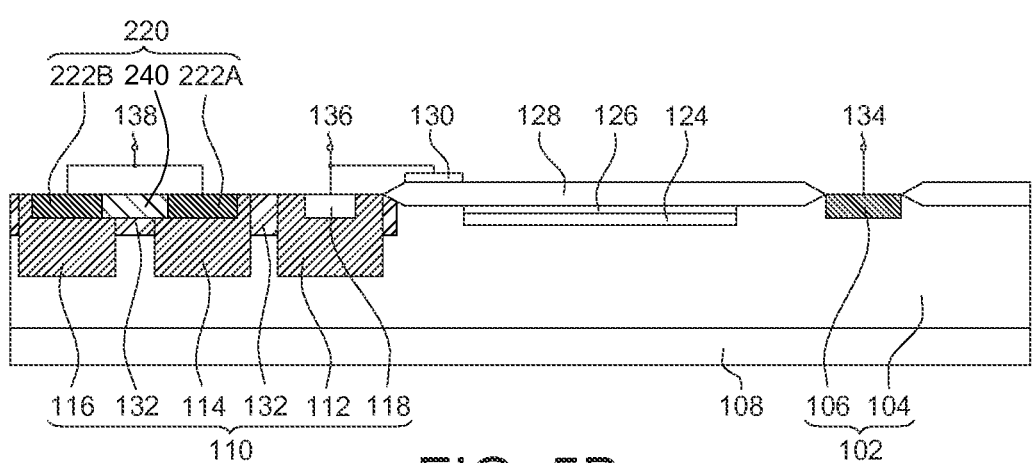
FIG. 5B is a cross-section view of the bipolar junction transistor along BB line in FIG. 5A.
Figure 5C:
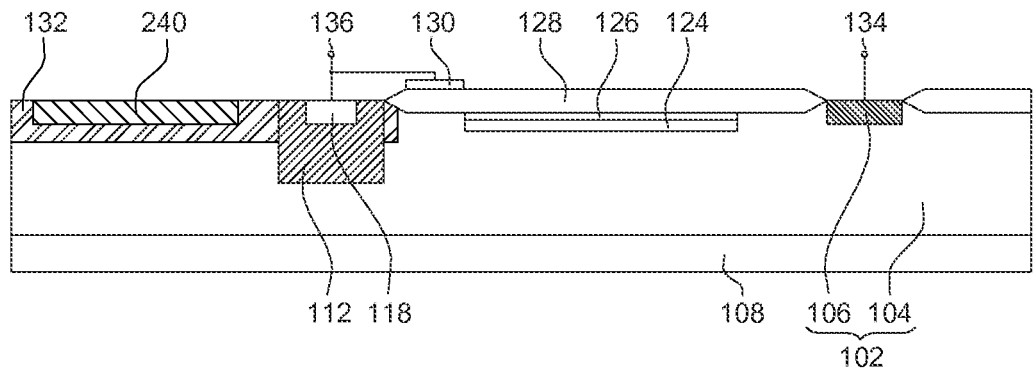
FIG. 5C is a cross-section view of the bipolar junction transistor along CC line in FIG. 5A.

FIG. 5A to FIG. 5C respectively illustrate the bipolar junction transistor of FIG. 3A to FIG. 3C after diffusing the well regions 112, 114, 116 of the second doped region 110 and the contact regions 222A, 222B of the third doped region 220. The step of diffusing the well regions 112, 114, 116 is for forming connecting regions 132 of the second doped region 110. The connecting regions 132 are adjoined between the well regions 112, 114, 116, and have the second type conductivity. The lower surfaces of the well regions 112, 114, 116 are under the lower surfaces of the connecting regions 132. The step of diffusing the contact regions 222A, 222B is for forming the connecting region 240 of the third doped region 220. The connecting region 240 is adjoined between the contact regions 222A, 222B, and has the first type conductivity. The connecting region 240 of the third doped region 220 is on the connecting region 132 of the second doped region 110. The well regions 112, 114, 116 of the second doped region 110 and the contact regions 222A, 222B of the third doped region 220 may be diffused by a method comprising an annealing step. The annealing step may be performed at suitable timing. For example, the annealing step may be performed after forming the contact regions 222A, 222B of the third doped region 220.

Referring to FIG. 5B and FIG. 5C, the first doped region 102 of the bipolar junction transistor may be electrically connected to the collector voltage 134 through the contact region 106. The second doped region 110 may be electrically connected to the base voltage 136 through the contact region 118. The third doped region 220 may be electrically connected to the emitter voltage 138 through the contact regions 222A, 222B. In other words, the first doped region 102 comprising the well region 104 and the contact region 106 having the first type conductivity such as N-type conductivity is functioned as the collector. The second doped region 110 comprising the well regions 112, 114, 116, the connecting regions 132 and the contact region 118 having the second type conductivity such as P-type conductivity is functioned as the base. The third doped region 220 comprising the contact regions 222A, 222B having the first type conductivity such as N-type conductivity is functioned as the emitter. The third doped region 220 comprising the contact regions 222A, 222B having the first type conductivity such as N-type conductivity is functioned as the emitter. The conductive structure 130 may be electrically connected to the structure voltage. In one embodiment, the structure voltage is coupled to the base voltage 136.

In embodiments, the well regions 112, 114, 116 after being diffused and the connecting regions 132 formed by the diffusion have the dopant concentration lower than the dopant concentration of the well regions 112, 114, 116 before being diffused, and it can improve the Beta β of the bipolar junction transistor. In addition, the formed connecting regions 132 can have tiny features such as a shallow depth or a narrow width, and it can increase the base resistance and improve the Beta β. Thus, in other words, in embodiments, the connecting regions 132 may be adjusting for controlling the Beta β of the bipolar junction transistor, by adjusting the conditions of the well regions 112, 114, 116 of the second doped region 110, such as adjusting the gap size between the well regions 112, 114, 116, or adjusting the process (such as the annealing process) parameters for diffusing the well regions 112, 114, 116.

Figure 6A:
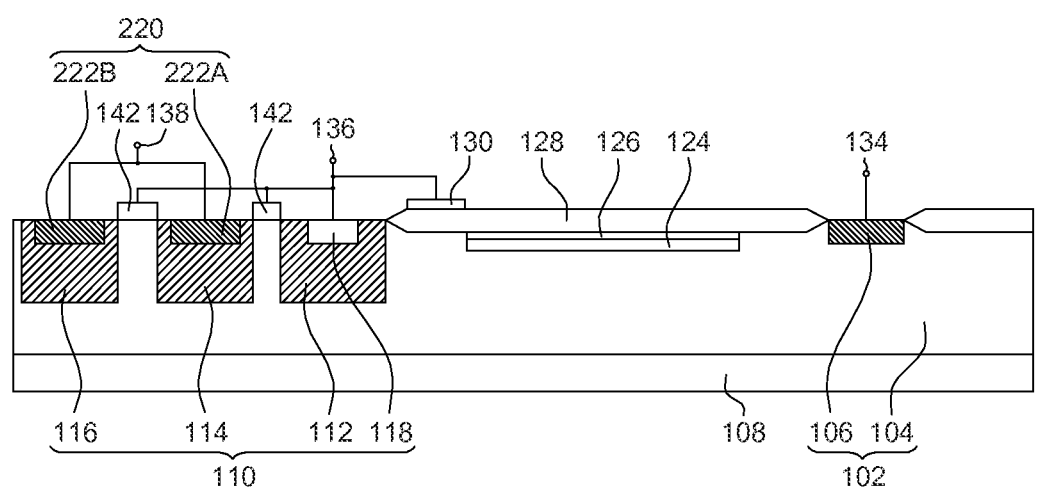
FIG. 6A illustrates a cross-section view of the bipolar junction transistor according to one embodiment.

FIG. 6A illustrates a cross-section view of the bipolar junction transistor according to one embodiment. Gate structures 142 are disposed on the well region 104 of the first doped region 102 between the well regions 112, 114, 116. The gate structure 142 comprises a gate dielectric layer and a gate electrode layer on the gate dielectric layer. The gate dielectric layer may comprise an oxide, a nitride, such as silicon oxide, silicon nitride, silicon oxynitride, or other suitable materials. The gate electrode layer may comprise polysilicon, a metal, a metal silicide, or other suitable materials. The polysilion may be formed by a single poly process or a double poly process.

Figure 6B:
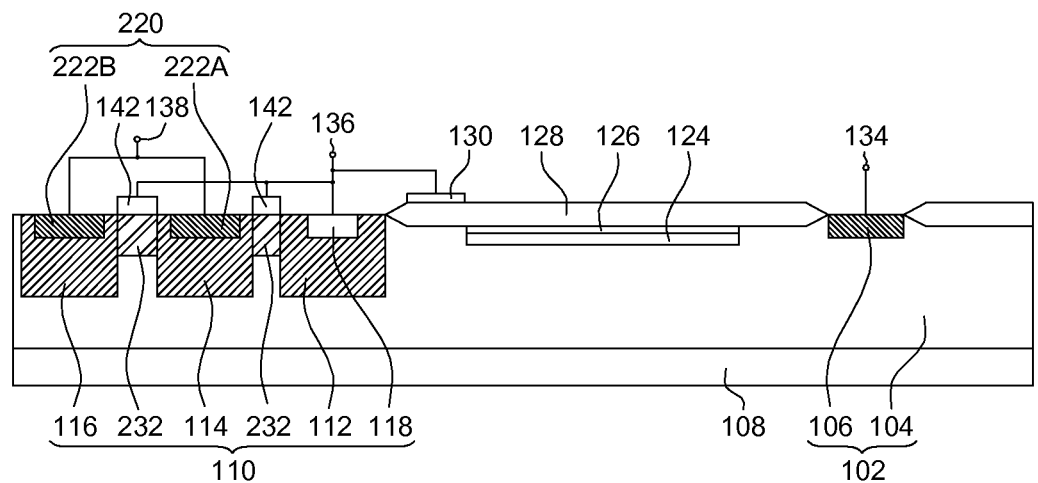
FIG. 6B illustrates a cross-section view of the bipolar junction transistor according to one embodiment.

FIG. 6B illustrates an operating method for the bipolar junction transistor in FIG. 6A. A gate voltage is provided to the gate structures 142 to form connecting regions 232 having the second type conductivity such as P-type conductivity in the well region 104 of the first doped region 102 having the first type conductivity such as N-type conductivity under the gate structures 142. The connecting regions 232 are adjoined between the well regions 112, 114, 116. In one embodiment, the gate voltage is coupled to the base voltage 136. In addition, the first doped region 102 may be electrically connected to the collector voltage 134 through the contact region 106. The second doped region 110 may be electrically connected to the base voltage 136 through the contact region 118. The third doped region 220 may be electrically connected to the emitter voltage 138 through the contact regions 222A, 222B. In other words, the first doped region 102 comprising the well region 104 and the contact region 106 having the first type conductivity such as N-type conductivity is functioned as the collector. The second doped region 110 comprising the well regions 112, 114, 116, the connecting regions 232 and the contact region 118 having the second type conductivity such as P-type conductivity is functioned as the base. The third doped region 220 comprising the contact regions 222A, 222B having the first type conductivity such as N-type conductivity is functioned as the emitter. The third doped region 220 comprising the contact regions 222A, 222B having the first type conductivity such as N-type conductivity is functioned as the emitter. The conductive structure 130 may be electrically connected to the structure voltage. In one embodiment, the structure voltage is coupled to the base voltage 136.

In embodiments, the profile and the carrier concentration of the connecting regions 232 formed in the well region 104 may be controlled for the desired devices characteristics, by adjusting the gate voltage providing to the gate structures 142. For example, the connecting regions 232 may be controlled to have low carrier concentration so as to improve the Beta β of the bipolar junction transistor. In addition, the connecting regions 232 can be controlled to have fine features easily to improve the Beta β of the bipolar junction transistor.

Figure 7:
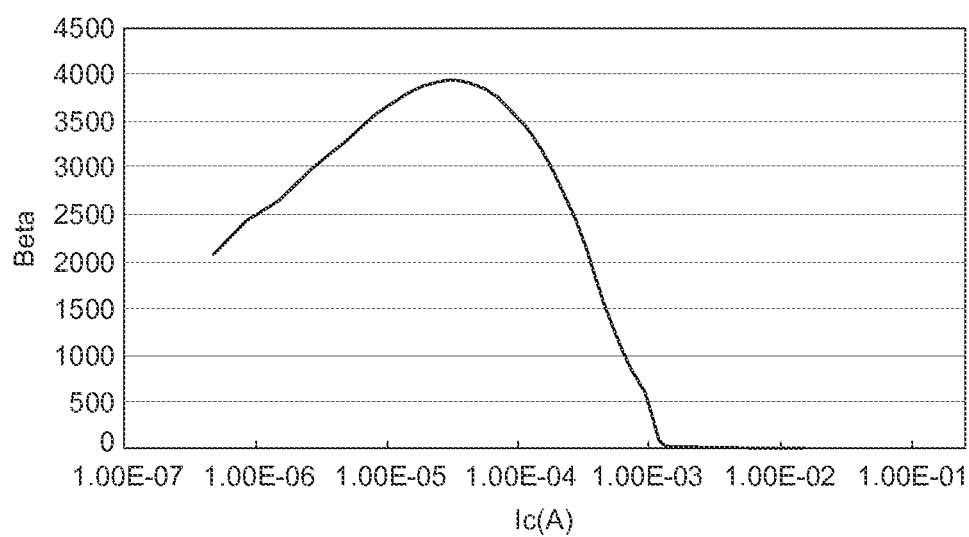
FIG. 7 shows electrical curves of the bipolar junction transistor according to one embodiment.
Figure 8:
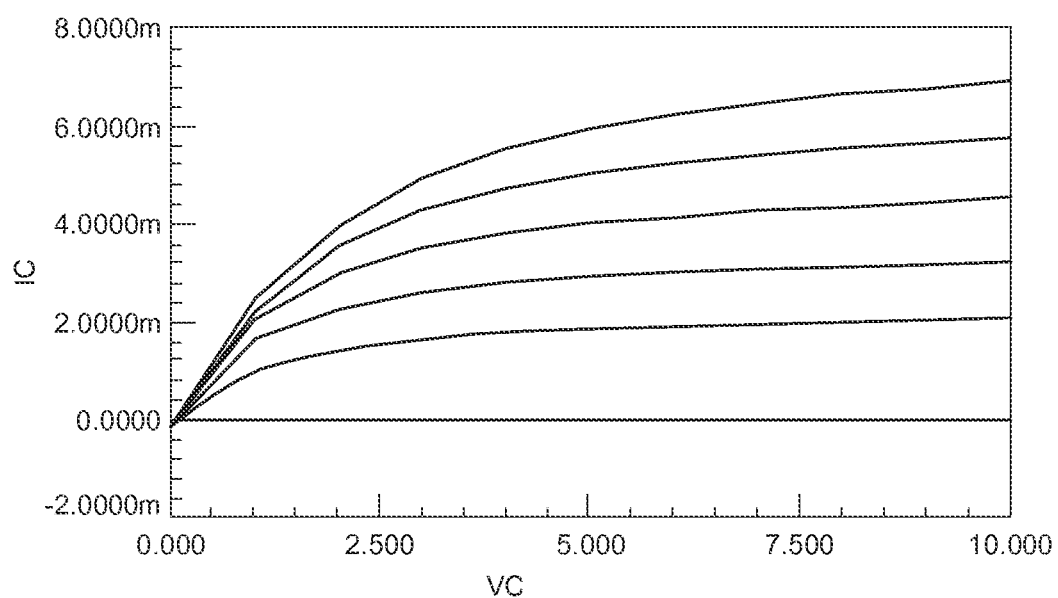
FIG. 8 shows electrical curves of the bipolar junction transistor according to one embodiment.

FIG. 7 and FIG. 8 are electrical curves of the bipolar junction transistor in embodiments. From FIG. 7, it is found that the Beta β of the bipolar junction transistor reaches to about 3900. From FIG. 8, it is found that the Early effect of the bipolar junction transistor is not serious.

In the described embodiments, the first type conductivity is N-type conductivity and the second type conductivity is P-type conductivity. However, the present disclosure is not limited thereto. In other embodiments, the first type conductivity may be P-type conductivity, and the second type conductivity may be N-type conductivity.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bipolar junction transistor, comprising:
a first doped region having a first type conductivity;
a second doped region comprising well regions formed in the first doped region, having a second type conductivity opposite to the first type conductivity, and separated from each other by the first doped region;
a third doped region having the first type conductivity, formed in the well regions or in the first doped region between the well regions;
a dielectric structure on the first doped region;
a conductive structure on the dielectric structure, wherein the conductive structure comprises poly silicon;
a plurality of first top doped layers having the second type conductivity and on the first doped region; and
a plurality of second top doped layers having the first type conductivity and on the first top doped layer, wherein the second top doped layers are separated by the first doped region.

2. The bipolar junction transistor according to claim 1, wherein the second doped region further comprises a connecting region adjoined between the well regions and having the second type conductivity, lower surfaces of the well regions is under a lower surface of the connecting region.

3. The bipolar junction transistor according to claim 2, wherein the third doped region comprises a contact region having the first type conductivity and between the well regions and the connecting region, the contact region is on the connecting region.

4. The bipolar junction transistor according to claim 1, wherein the third doped region comprises a contact region having the first type conductivity and formed in the second doped region.

5. The bipolar junction transistor according to claim 1, wherein the first doped region is electrically connected to a collector voltage, the second doped region is electrically connected to a base voltage, the third doped region is electrically connected to an emitter voltage.

6. The bipolar junction transistor according to claim 1, wherein each of the second doped region and the third doped region has a contact region, the contact region of the second doped region has the second type conductivity, the contact region of the third doped region has the first type conductivity, the contact region of the second doped region and the contact region of the third doped region are respectively formed in the well regions separated from each other.

7. The bipolar junction transistor according to claim 1, further comprising a gate structure on the first doped region between the well regions.

8. The bipolar junction transistor according to claim 1, wherein each of the first doped region and the second doped region comprises a contact region, the contact region of the first doped region has the first type conductivity, the contact region of the second doped region has the second type conductivity, each of the first top doped layers is between the contact region of the first doped region and the contact region of the second doped region.

9. An operating method for a bipolar junction transistor, wherein the bipolar junction transistor comprises:
a first doped region having a first type conductivity;
a second doped region comprising well regions formed in the first doped region, wherein the well regions have a second type conductivity opposite to the first type conductivity, the well regions are separated from each other by the first doped region; and
a third doped region having the first type conductivity, wherein the third doped region is formed in the well regions or in the first doped region between the well regions a dielectric structure on the first doped region;
a conductive structure on the dielectric structure, wherein the conductive structure comprises poly silicon;
a plurality of first top doped layers having the second type conductivity and on the first doped region; and a plurality of second top doped layers having the first type conductivity and on the first top doped layer, wherein the second top doped layers are separated by the first doped region, the operating method comprises:

providing a collector voltage to the first doped region;

providing a base voltage to the second doped region; and providing an emitter voltage to the third doped region.

10. The operating method for the bipolar junction transistor according to claim 9, wherein the second doped region further comprises a connecting region adjoined between the well regions and having the second type conductivity, lower surfaces of the well regions are under a lower surface of the connecting region.

11. The operating method for the bipolar junction transistor according to claim 10, wherein the third doped region comprises a contact region having the first type conductivity and between the well regions and the connecting region, the contact region is on the connecting region.

12. The operating method for the bipolar junction transistor according to claim 9, wherein the bipolar junction transistor further comprises a gate structure on the first doped region between the well regions, the operating method further comprises providing a gate voltage to the gate structure for forming a connecting region in the first doped region under the gate structure.

13. The operating method for the bipolar junction transistor according to claim 12, wherein the connecting region has the second type conductivity and adjoined between the well regions.

14. The operating method for the bipolar junction transistor according to claim 12, wherein the gate voltage is coupled to the base voltage.

15. The operating method for the bipolar junction transistor according to claim 9, further comprising providing a structure voltage to the conductive structure.

16. The operating method for the bipolar junction transistor according to claim 15, wherein the structure voltage is coupled to the base voltage.

\* \* \* \* \*